(12) United States Patent
Sano et al.

(10) Patent No.: US 11,915,849 B2
(45) Date of Patent: Feb. 27, 2024

(54) INDUCTOR COMPONENT

(71) Applicant: Murata Manufacturing Co., Ltd., Kyoto-fu (JP)

(72) Inventors: Rikiya Sano, Nagaokakyo (JP); Hiroyuki Kanbara, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 956 days.

(21) Appl. No.: 16/843,686

(22) Filed: Apr. 8, 2020

(65) Prior Publication Data

US 2020/0381159 A1 Dec. 3, 2020

(30) Foreign Application Priority Data

Jun. 3, 2019 (JP) ................................. 2019-103853

(51) Int. Cl.
| | | |
|---|---|---|
| *H01F 17/00* | (2006.01) | |
| *H01F 27/28* | (2006.01) | |
| *H01F 41/04* | (2006.01) | |
| *H01F 27/32* | (2006.01) | |
| *H05K 3/12* | (2006.01) | |

(52) U.S. Cl.
CPC ..... *H01F 17/0013* (2013.01); *H01F 27/2804* (2013.01); *H01F 27/32* (2013.01); *H01F 41/041* (2013.01); *H05K 3/12* (2013.01); *H01F 2017/004* (2013.01); *H01F 2027/2809* (2013.01)

(58) Field of Classification Search
CPC ............. H01F 17/0013; H01F 27/2804; H01F 2027/2809; H01F 17/0006; H01F 5/003; H01F 27/32; H01F 2017/004
USPC .................................................. 336/200, 232
See application file for complete search history.

(56) References Cited

U.S. PATENT DOCUMENTS

| | | | | |
|---|---|---|---|---|
| 2016/0276089 A1* | 9/2016 | Inoue | ..................... | H01F 27/292 |
| 2017/0352467 A1* | 12/2017 | Kakiuchi | ................ | H01F 27/29 |
| 2018/0068780 A1* | 3/2018 | Shimoda | ................ | H01F 27/292 |

FOREIGN PATENT DOCUMENTS

| | | | | | |
|---|---|---|---|---|---|
| JP | 2004031833 | A | * | 1/2004 | |
| JP | 2007214509 | A | * | 8/2007 | |
| JP | 2012084623 | A | * | 4/2012 | |
| JP | 2017118089 | A | | 6/2017 | |
| JP | 2018019033 | A | * | 2/2018 | |
| JP | 2019067954 | A | * | 4/2019 | |
| JP | 2020-198369 | A | | 12/2020 | |
| WO | WO-2017122381 | A1 | * | 7/2017 | ........... B32B 17/061 |

* cited by examiner

*Primary Examiner* — Tszfung J Chan
(74) *Attorney, Agent, or Firm* — Studebaker & Brackett PC

(57) ABSTRACT

An inductor component comprising an element body; a helically wound coil disposed in the element body; and an external electrode disposed in the element body and electrically connected to the coil. The element body includes a plurality of insulating layers and a mark layer constituting a portion of an outer surface of the element body, and a K abundance ratio (atom %) in the mark layer is higher than a K abundance ratio (atom %) in the insulating layers.

20 Claims, 9 Drawing Sheets

INDUCTOR COMPONENT

CROSS REFERENCE TO RELATED APPLICATION

This application claims benefit of priority to Japanese Patent Application 2019-103853 filed Jun. 3, 2019, the entire content of which is incorporated herein by reference.

BACKGROUND

Technical Field

The present disclosure relates to an inductor component.

Background Art

A conventional inductor component is described in Japanese Laid-Open Patent Publication No. 2017-118089. The inductor component includes an element body, a spirally wound coil disposed in the element body, and an external electrode disposed in the element body and electrically connected to the coil. The element body is made up of a sintered body and includes multiple insulating layers and a mark layer on the outside in a lamination direction of the multiple insulating layers. The mark layer is different in color from the insulating layers.

Since the performance of the inductor component changes due to interference of a magnetic flux, it is important to control a mounting direction of the inductor component. This directional alignment property can be achieved by defining the outside of the element body in the lamination direction of the insulating layers as the mark layer different in color from the insulating layers so that the direction of the inductor component can easily be distinguished.

SUMMARY

In the conventional inductor component, the mark layer contains a pigment such as a white pigment or a black pigment, so that the color is made different from the insulating layers.

However, the pigment is generally a crystalline material more stable at high temperature than the insulating layers, so that the addition of the pigment to the mark layer makes a firing temperature for achieving a favorable sintered state higher as compared to the insulating layer not containing the pigment.

Therefore, this causes a problem that when an element body is formed by combining the mark layer containing a pigment and the insulating layers not containing a pigment as in a conventional inductor component, a favorable sintered state is difficult to achieve for both the mark layer and the insulating layers at the same time.

Therefore, the present disclosure provides an inductor component in which a favorable sintered state can be achieved for both the mark layer and the insulating layers at the same time.

Accordingly, an aspect of the present disclosure provides an inductor component comprising an element body; a helically wound coil disposed in the element body; and an external electrode disposed in the element body and electrically connected to the coil. The element body includes a plurality of insulating layers and a mark layer constituting a portion of an outer surface of the element body, and a K abundance ratio (atom %) in the mark layer is higher than a K abundance ratio (atom %) in the insulating layers.

According to the aspect, a favorable sintered state can be achieved for both the mark layer and the insulating layers at the same time.

In an embodiment of the inductor component, the insulating layer contains an amorphous intra-insulating-layer base material and an intra-insulating-layer crystal, and the mark layer includes an amorphous intra-mark-layer base material and an intra-mark-layer crystal containing at least one or more pigments. Also, in a reflection spectrum for light having a wavelength of 380 nm or more and 780 nm or less (i.e., from 380 nm to 780 nm), a maximum value of reflectance of the pigment of the intra-mark-layer crystal is greater than a maximum value of reflectance of the intra-insulating-layer crystal.

According to the embodiment, since the intra-mark-layer crystal and the intra-insulating-layer crystal are different in the maximum value of the reflectance for the visible light region, favorable appearance distinguishability is obtained between the mark layer and the insulating layer.

In an embodiment of the inductor component, in the reflection spectrum for light having a wavelength of 380 nm or more and 780 nm or less (i.e., from 380 nm to 780 nm), the reflectance of the pigment of the intra-mark-layer crystal has the maximum value at a wavelength different from a wavelength at which the reflectance of the intra-insulating-layer crystal has the maximum value.

According to the embodiment, since the intra-mark-layer crystal and the intra-insulating-layer crystal are different in wavelength at which the reflectance for the visible light region has the maximum value and are therefore clearly different in color from each other, distinguishability in appearance is favorably obtained between the mark layer and the insulating layer.

In an embodiment of the inductor component, in the reflection spectrum for light having a wavelength of 380 nm or more and 780 nm or less (i.e., from 380 nm to 780 nm), the reflectance of the intra-insulating-layer crystal is 0.4 or less.

According to the embodiment, favorable distinguishability can be obtained between the mark layer containing the pigment and the insulating layer.

In an embodiment of the inductor component, the intra-insulating-layer crystal is quartz.

According to the embodiment, the refractive index of the intra-insulating-layer crystal can be reduced.

In an embodiment of the inductor component, the pigment is an oxide containing at least one of Ti, Co, Al, and Zr.

According to the embodiment, the mark layer with favorable visibility can be obtained.

In an embodiment of the inductor component, the intra-mark-layer base material is an amorphous glass containing B, Si, O, and K as main components.

According to the embodiment, the mark layer having sufficient mechanical strength and insulation reliability can be obtained.

In an embodiment of the inductor component, the intra-insulating-layer base material is an amorphous glass containing B, Si, O, and K as main components.

According to the embodiment, the insulating layers having sufficient mechanical strength and insulation reliability can be obtained.

In an embodiment of the inductor component, the mark layer has a through-hole constituting a distinguishing mark, and the insulating layer is exposed from the through-hole.

According to the embodiment, image recognition is enabled by using the distinguishing mark, so that mechanical sorting and removal can be performed.

In an embodiment of the inductor component, the insulating layer enters the through-hole.

According to the embodiment, the need for a step of removing the insulating layer filled in the through-hole is eliminated, and man-hours can be reduced.

In an embodiment of the inductor component, a shortest distance between an inner surface of the through-hole and the coil is 10 μm or more when viewed in a direction orthogonal to the mark layer.

According to the embodiment, the coil can be prevented from coming close to the through-hole, and stable distinguishability can be obtained.

According to the inductor component of an aspect of the present disclosure, a favorable sintered state can be achieved for both the mark layer and the insulating layer at the same time.

DETAILED DESCRIPTION

An inductor component of an aspect of the present disclosure will now be described in detail with reference to shown embodiments. The drawings include schematics and may not reflect actual dimensions or ratios.

First Embodiment

Figure 1:
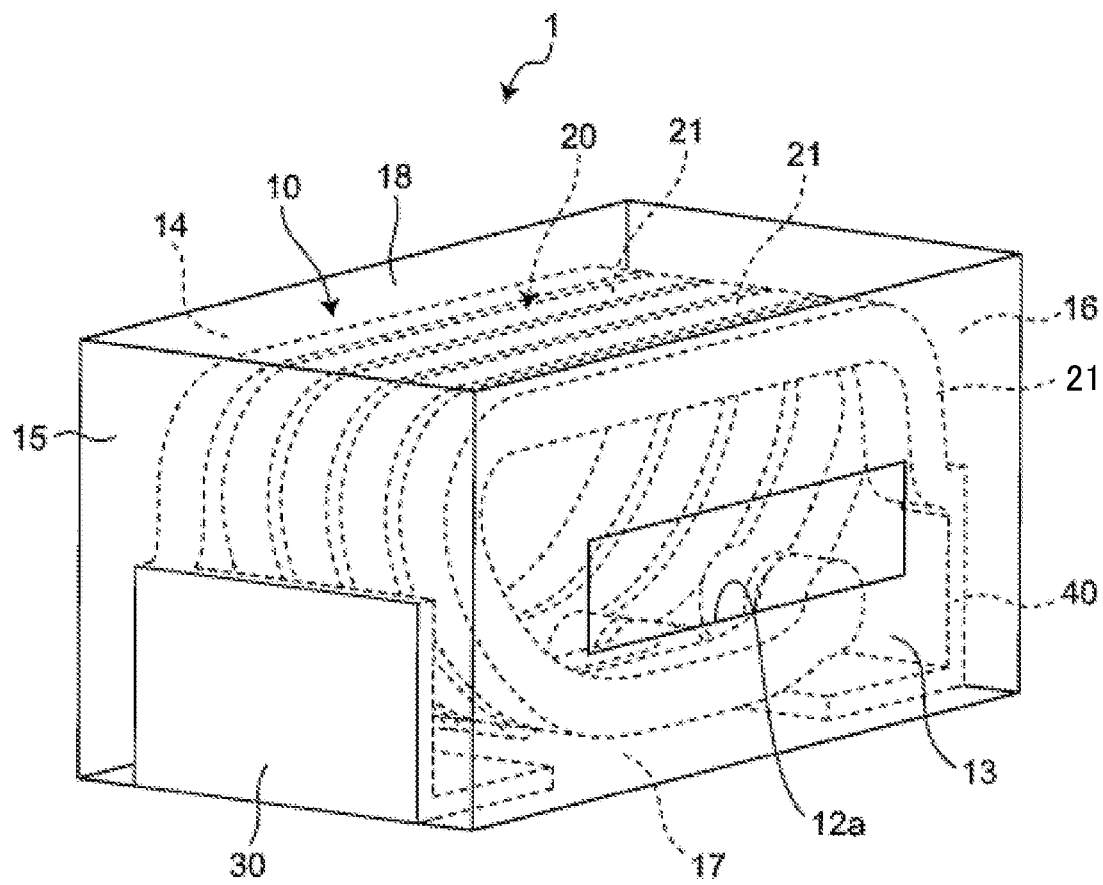
FIG. 1 is a transparent perspective view showing a first embodiment of an inductor component of the present disclosure.
Figure 1:
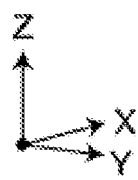
Figure 2:
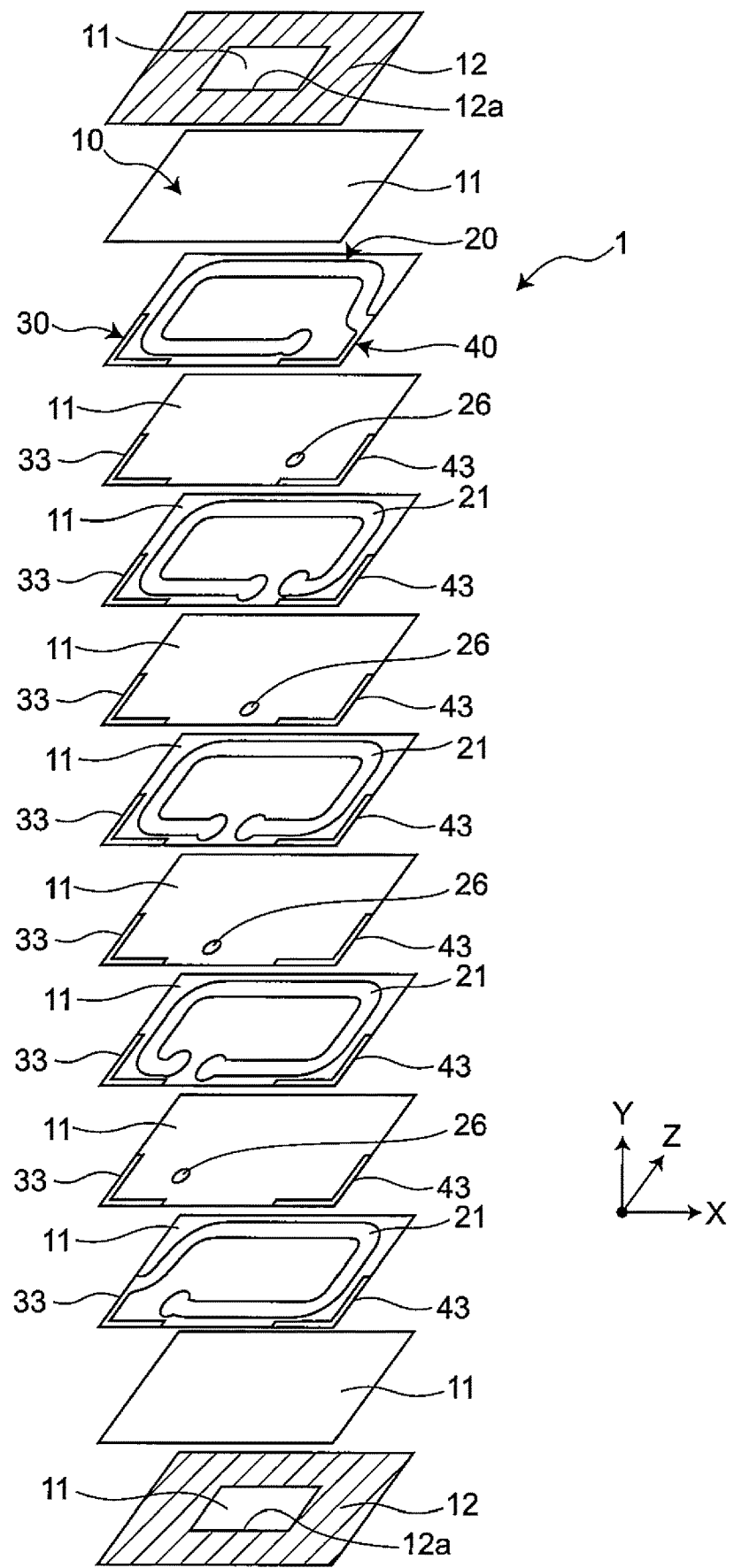
FIG. 2 is an exploded perspective view of the inductor component.
Figure 3:
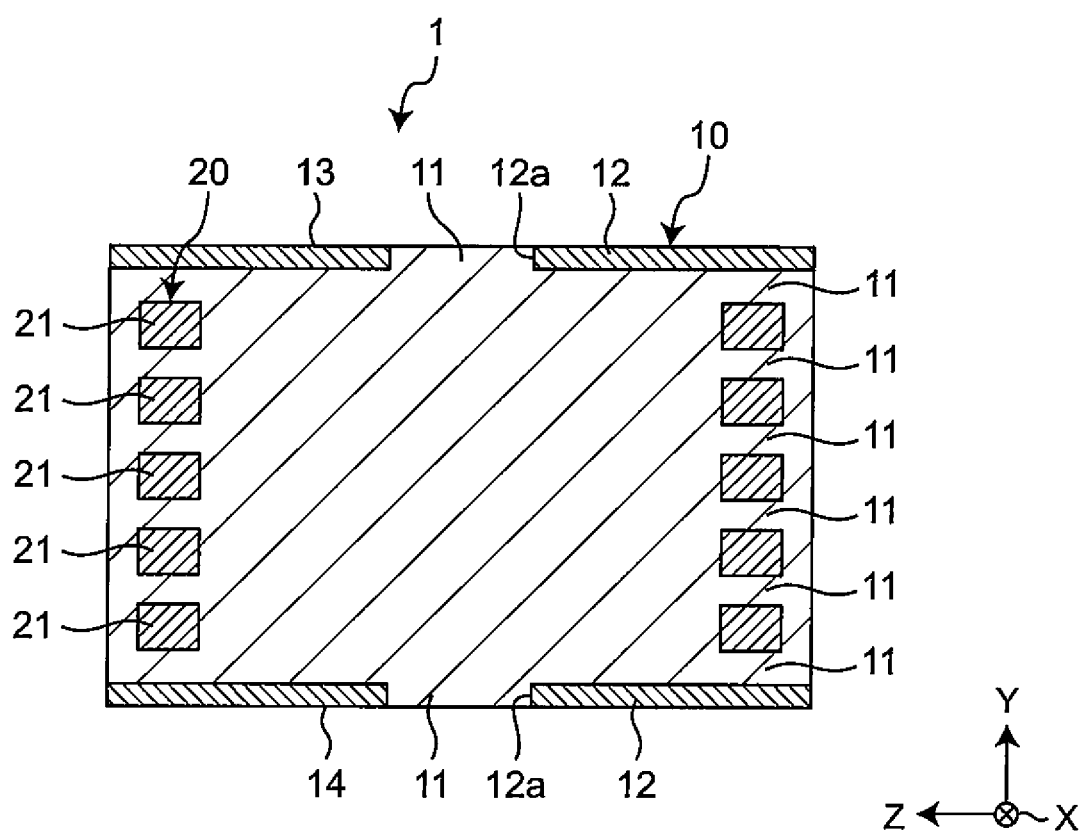
FIG. 3 is a cross-sectional view of an inductor component.

FIG. 1 is a perspective view showing a first embodiment of an inductor component. FIG. 2 is an exploded perspective view of the inductor component. FIG. 3 is a cross-sectional view of the inductor component taken along a Y-Z plane. As shown in FIGS. 1, 2, and 3, an inductor component 1 has an element body 10, a helical coil 20 disposed inside the element body 10, and a first external electrode 30 and a second external electrode 40 disposed in the element body 10 and electrically connected to the coil 20.

The inductor component 1 is electrically connected via the first and second external electrodes 30, 40 to a wiring of a circuit board not shown. The inductor component 1 is used as an impedance matching coil (matching coil) of a high-frequency circuit, for example, and is used for an electronic device such as a personal computer, a DVD player, a digital camera, a TV, a portable telephone, automotive electronics, and medical/industrial machinery. However, the inductor component 1 is not limited to these uses and is also usable for a tuning circuit, a filter circuit, and a rectifying/smoothing circuit, for example.

The element body 10 is formed into a substantially rectangular parallelepiped shape. The outer surface of the element body 10 is made up of a first side surface 13, a second side surface 14 opposite to the first side surface 13, a first end surface 15 connected between the first side surface 13 and the second side surface 14, a second end surface 16 opposite to the end surface 15, a bottom surface 17 connected between the first end surface 15 and the second end surface 16, and a top face 18 opposite to the bottom surface 17. As shown in the figures, an X direction is a direction perpendicular to the first end surface 15 and the second end surface 16; a Y direction is a direction perpendicular to the first side surface 13 and the second side surface 14; and a Z direction is a direction perpendicular to the bottom surface 17 and the top surface 18. The X, Y, Z directions are orthogonal to each other. For example, the element body 10 is 0.4 mm in the X direction, 0.2 mm in the Y direction, and 0.2 mm in the Z direction.

The element body 10 includes multiple insulating layers 11 and mark layers 12 constituting portions of the outer surface of the element body 10. The multiple insulating layers 11 are laminated in the Y direction. The mark layers 12 are laminated as outermost layers of the element body 10 on both sides in the laminating direction of the insulating layer 11. The mark layers 12 are indicated by hatching in FIG. 2. The mark layers 12 form the first side surface 13 and the second side surface 14 that are portions of the outer surface of the element body 10. The insulating layers 11 and the mark layers 12 have a layer shape extending in an X-Z plane orthogonal to the lamination direction in the Y direction. In the multiple insulating layers 11, an interface between two adjacent insulating layers 11 may not be clear due to firing etc.

The insulating layers 11 contain an amorphous intra-insulating-layer base material and an intra-insulating-layer crystal. The intra-insulating-layer crystal has an insulating property and is preferably quartz (crystal quartz). The crystallinity of the quartz is not particularly limited. As a result, the refractive index of the intra-insulating-layer crystal can be reduced. The intra-insulating-layer base material is a solid having an insulating property. The intra-insulating-layer base material is preferably amorphous glass such as borosilicate glass containing B, Si, O, and K as main components. As a result, the insulating layers having sufficient mechanical strength and insulation reliability can be obtained. Other than borosilicate glass, glass may be those containing $SiO_2$, $B_2O_3$, $K_2O$, $Li_2O$, CaO, ZnO, $Bi_2O_3$, and/or $Al_2O_3$, for example, $SiO_2$—$B_2O_3$—$K_2O$-based glass, $SiO_2$—$B_2O_3$—$Li_2O$—CaO-based glass, $SiO_2$—$B_2O_3$—$Li_2O$—CaO—ZnO-based glass, or $Bi_2O_3$—$B_2O_3$—$SiO_2$—$Al_2O_3$-based glass. Two or more of these glass components may be combined. The intra-insulating-layer base material may not be glass, may be another inorganic material, or may be an organic material such as a resin, and even in this case, the material is preferably amorphous. Furthermore, the inorganic material and the organic material may be combined. The insulating layers 11 may not contain the intra-insulating-layer crystal.

The mark layers 12 have distinguishability in appearance as compared to the insulating layers 11 and can achieve a favorable directional alignment property of the inductor component 1. The mark layers 12 includes an amorphous intra-mark-layer base material and an intra-mark-layer crystal. The intra-mark-layer base material is the same as the intra-insulating-layer base material and is preferably amorphous glass such as borosilicate glass containing B, Si, O, and K as main components. As a result, the mark layers having sufficient mechanical strength and insulation reliability can be obtained. The intra-mark-layer crystal includes at least one or more crystalline pigments. By adding the pigment as described above, the mark layer 12 can be colored so that the mark layer 12 can be provided with visibility (distinguishability). The pigment is preferably an oxide containing at least one of Ti, Co, Al, and Zr, for example, $CoAl_2O_4$ (cobalt blue) and $TiO_2$ (titania). As a result, the mark layers 12 with favorable visibility can be obtained.

The first external electrode 30 and the second external electrode 40 are made of a conductive material such as Ag, Cu, or Au, and glass particles, for example. The first external electrode 30 has an L-shape disposed over the first end surface 15 and the bottom surface 17. The second external electrode 40 has an L-shape disposed over the second end surface 16 and the bottom surface 17. The first external electrode 30 is made up of multiple external electrode conductor layers 33 laminated in surface contact with each other. The second external electrode 40 is made up of multiple external electrode conductor layers 43 laminated in surface contact with each other.

For example, the coil 20 is made of the same conductive material and glass particles as the first and second external electrodes 30, 40. The coil 20 is helically wound along the lamination direction of the insulating layers 11. A first end of the coil 20 is connected to the first external electrode 30, and a second end of the coil 20 is connected to the second external electrode 40. In this embodiment, the coil 20 and the first and second external electrodes 30, 40 are integrated without a clear boundary; however, the present disclosure is not limited thereto, and the coil and the external electrodes may be made of different materials or by different method so that a boundary may exist. The first external electrode 30, the second external electrode 40, and the coil 20 may not include glass particles.

Although the coil 20 is formed in a substantially oval shape when viewed in an axial direction, the present disclosure is not limited to this shape. The shape of the coil 20 may be circular, elliptical, rectangular, or other polygonal shapes, for example. The axial direction of the coil 20 refers to a direction parallel to the central axis of the helix formed by winding the coil 20. The axial direction of the coil 20 and the lamination direction of the insulating layers 11 are the same direction. As used herein, the term "parallel" refers not only to a strictly parallel relationship but also to a substantially parallel relationship in consideration of a realistic variation range.

The coil 20 includes coil wirings 21 wound along planes. The multiple coil wirings 21 are laminated along the axial direction. The coil wirings 21 are formed by being wound on principal surfaces (X-Z planes) of the insulating layers 11 orthogonal to the axial direction. The coil wirings 21 adjacent to each other in the lamination direction are electrically connected in series through via wirings 26 penetrating the insulating layers 11 in a thickness direction (Y direction). The multiple coil wirings 21 are electrically connected to each other in series in this way to constitute a helix. Specifically, the coil 20 has a configuration in which the multiple coil wirings 21 electrically connected to each other in series and having the number of turns less than one are laminated, and the coil 20 has a helical shape. The coil wirings 21 are each made up of a single coil conductor layer 25. The coil wirings 21 may be each made up of multiple coil conductor layers laminated in surface contact with each other so that the coil wirings 21 with a high aspect ratio and a high rectangularity can be formed. Further, the coil wirings 21 may have a spiral shape with the number turns equal to or greater than one.

The element body 10 includes the insulating layers 11 and the mark layers 12, and an abundance ratio (atom %: hereinafter referred to as "K abundance ratio") of K (potassium) in the mark layers 12 is higher than the K abundance ratio (atom %) in the insulating layers 11. Obviously, the K abundance ratio in the insulating layer 11 may be zero.

Regarding a method of obtaining the K abundance ratio in this disclosure, the ratio can be measured by conducting composition analysis (quantitative analysis) of a DPA (Destructive Physical Analysis) cross section passing through the center of the element body 10 of the inductor component 1 and parallel to the lamination direction with SEM (Scanning Electron Micrscope)-EDX (Energy Dispersive X-ray spectrometry)/WDX (Wavelength Dispersive X-ray spectrometry). As a result, at least the insulating layers 11 and the mark layers 12 can be compared and clearly distinguished.

Therefore, since the K abundance ratio in the mark layers 12 is higher than the K abundance ratio (atom %) in the insulating layers 11, a favorable sintered state can be achieved for both the mark layers 12 and the insulating layers 11 at the same time.

The reason is that K atoms in glass interfere with and give stress to a glass structure of —Si—O—Si—O— due to a size of the ionic radius, thereby destabilizing the glass bonding and lowering the glass softening point. Therefore, by making the K abundance ratio in the mark layers 12 higher than the K abundance ratio in the insulating layers 11, the increase in the glass softening point due to the addition of the pigment to the mark layer 12 is canceled out, and the glass softening point of the mark layers 12 comes closer to the glass softening point of the insulating layers 11. As a result, a firing temperature of the inductor component 1 can be set such that a favorable sintering state can be achieved for the mark layers 12 and the insulating layers 11 at the same time. Therefore, the strength and the insulation reliability of the element body 10 can be increased in the inductor component 1.

Regarding a method of manufacturing the mark layer 12 having the high K abundance ratio, for example, the mark layers 12 increased in an amount of K in advance may be prepared, or an adjustment may be made during manufacturing such that K in the insulating layers 11 and the mark layers 12 is concentrated in the mark layers 12.

As shown in FIGS. 1, 2, and 3, the mark layer 12 preferably has a through-hole 12a constituting a distinguishing mark. The insulating layer 11 is exposed from the through-hole 12a. As a result, image recognition is enabled by using the distinguishing mark, so that mechanical sorting and removal can be performed. Additionally, by recognizing the distinguishing mark with an image sorting device at the time of appearance sorting, the inductor component 1 having a different distinguishing mark can be selected and removed, which is useful for producing multiple types of products. Particularly, by providing the distinguishing mark, even the products having the same mark layers, insulating layers, and chip size can be distinguished from each other while the directional alignment property is maintained, so that the risk of mixing other types of products can further be reduced. The shape of the through-hole 12a is quadrangular or may be circular. The through-hole 12a having a quadrangular or circular shape can more easily be distinguished through image recognition.

As shown in FIGS. 2 and 3, a portion of the insulating layer 11 enters the through-hole 12a of the mark layer 12 on the lower side in the Y direction. For example, the insulating layer 11 is filled in the through-hole 12a so that a lower surface of the insulating layer 11 is flush with a lower surface of the mark layer 12. This eliminates the need for a step of removing the insulating layer 11 filled in the through-hole 12a, and man-hours can be reduced.

The reason is that when the mark layer 12 is formed in the lowermost layer in the lamination direction, a portion of the insulating layer 11 is filled in the through-hole 12a of the mark layer 12 when the upper insulating layer 11 is formed. Therefore, a step of removing the insulating layer 11 filled in the through-hole 12a is required for making the through-hole 12a hollow. However, by allowing the insulating layer 11 to fill the through-holes 12a, the man-hours can be reduced. A portion of the insulating layer 11 also enters the through-hole 12a of the mark layer 12 on the upper side in the Y direction.

Figure 4:
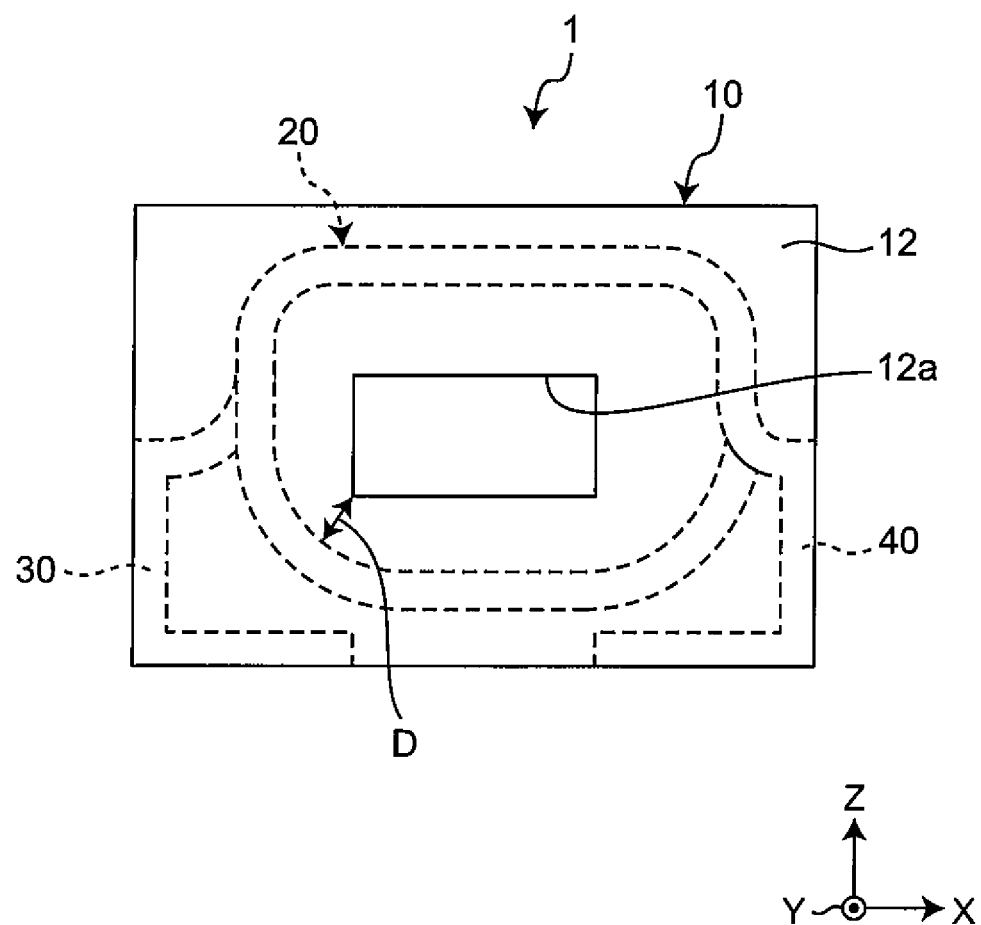
FIG. 4 is a plan view of an inductor component.

FIG. 4 is a plan view of the inductor component. In the present disclosure, the "plan view" means a view of the inductor component 1 viewed in the lamination direction (Y direction). As shown in FIG. 4, a shortest distance D between an inner surface of the through-hole 12a and the coil 20 is preferably 10 μm or more when viewed in the direction (Y direction) orthogonal to the mark layer 12. Therefore, the coil 20 can be prevented from coming close to the through-hole 12a, and stable distinguishability can be obtained. The reason is that when the coil 20 can be prevented from coming close to the through-hole 12a, the coil 20 in the element body 10 is hardly seen through the insulating layer 11 exposed from the through-hole 12a. This can reduce the risk of erroneous determination etc. at the time of directional alignment and appearance sorting during manufacturing. Additionally, when the shortest distance D is 10 μm or more, the coil 20 can be prevented from being seen through the insulating layer 11 exposed from the through-hole 12a even if the insulating layer 11 or the mark layer 12 is laminated in a slightly shifted manner during manufacturing of the inductor component 1, so that the accuracy of defect detection is improved, and in turn, the yield can be improved.

Figure 5:
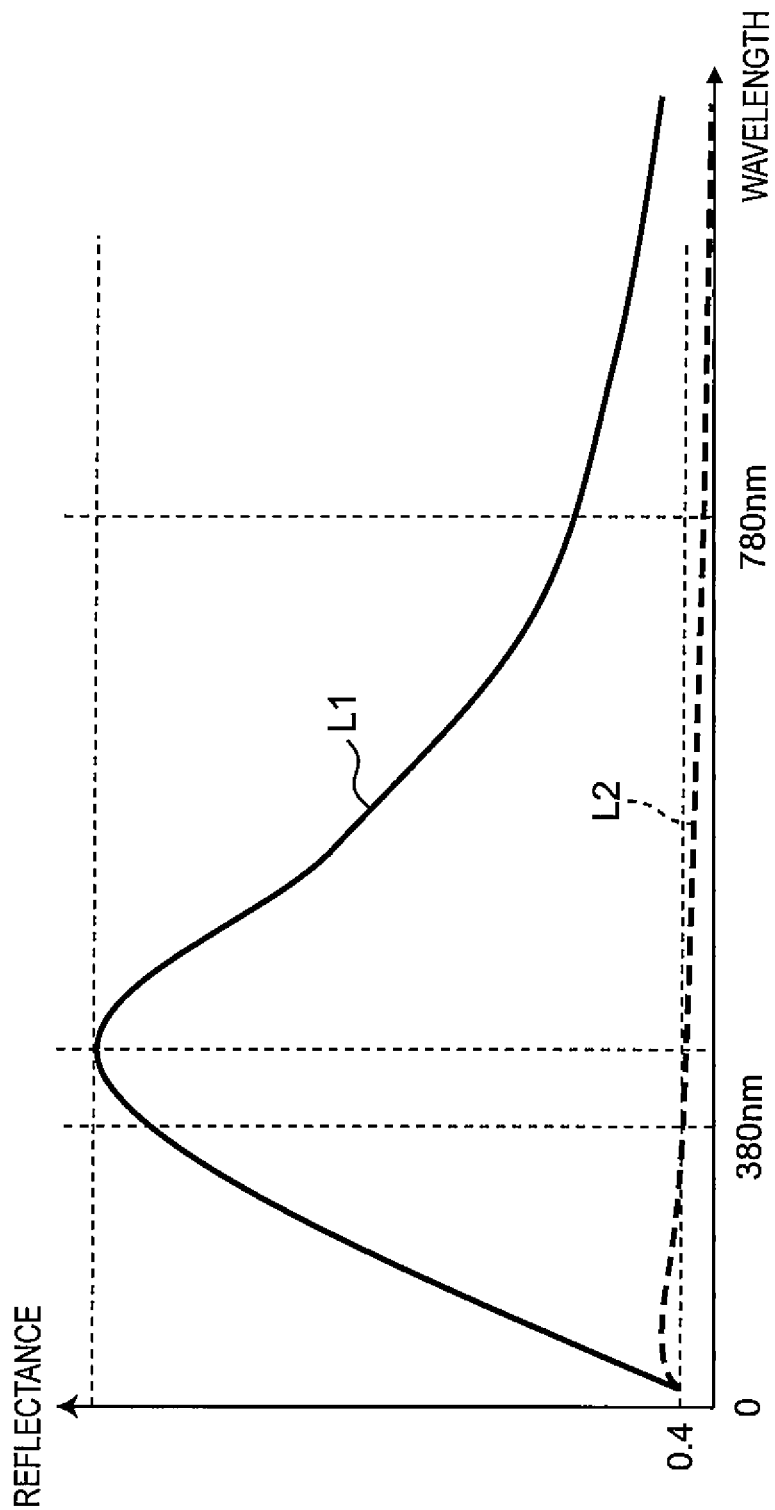
FIG. 5 is a graph showing a relationship between wavelength and reflectance of an intra-mark-layer crystal and an intra-insulating-layer crystal.

FIG. 5 is a graph showing a relationship between wavelength and reflectance of the intra-mark-layer crystal and the intra-insulating-layer crystal. As shown in FIG. 5, in the reflection spectrum for light having a wavelength of 380 nm or more and 780 nm or less (i.e., from 380 nm to 780 nm) (i.e., in a visible light region), a maximum value of reflectance of the pigment of the intra-mark-layer crystal of the mark layer 12 is preferably greater than a maximum value of reflectance of the intra-insulating-layer crystal of the insulating layer 11. In FIG. 5, the horizontal axis indicates the wavelength at which the reflection spectrum is measured, the vertical axis indicates the reflectance for the light having the corresponding wavelength, L1 denotes a graph of the reflectance of the pigment of the intra-mark-layer crystal, and L2 denotes a graph of the reflectance of the intra-insulating-layer crystal.

Regarding a method of obtaining the reflectance in this disclosure, a composition and a structure of a crystal contained in the inductor component can be identified by combining the crystal structure analysis using XRD (X-Ray Diffraction) etc. of the DPA cross section of the inductor component 1 and the composition analysis using SEM-EDX/WDX. If the composition and the structure of the crystal can be identified in this way, reflection spectrum characteristics for a light wavelength can be obtained by reference to a database such as a handbook of Chemistry, and the maximum value of the reflectance can thereby be obtained.

As a result, since the intra-mark-layer crystal and the intra-insulating-layer crystal of the inductor component 1 are different in the maximum value of the reflectance for the visible light region, distinguishability in appearance is favorably obtained between the mark layer 12 and the insulating layer 11. As a result, the inductor component 1 can achieve a favorable directional alignment property.

Preferably, in the reflection spectrum for light having a wavelength of 380 nm or more and 780 nm or less (i.e., from 380 nm to 780 nm), the reflectance of the pigment of the intra-mark-layer crystal has the maximum value at a wavelength different from a wavelength at which the reflectance of the intra-insulating-layer crystal has the maximum value. Thus, since the intra-mark-layer crystal and the intra-insulating-layer crystal are different in wavelength at which the reflectance for the visible light region has the maximum value and are therefore clearly different in color from each other, the distinguishability in appearance is favorably obtained between the mark layer 12 and the insulating layer 11. As a result, the inductor component 1 can achieve a favorable directional alignment property.

Preferably, in the reflection spectrum for light having a wavelength of 380 nm or more and 780 nm or less (i.e., from 380 nm to 780 nm), the reflectance of the intra-insulating-layer crystal is 0.4 or less. As a result, favorable distinguishability can be obtained between the mark layer 12 containing the pigment and the insulating layer 11. Additionally, if the insulating layer 11 is formed by a photolithography method, resolution can be improved.

The reason is that when the reflectance of the intra-insulating-layer crystal in the visible light region is reduced, a difference in reflectance can easily be made from the reflectance of the intra-mark-layer crystal containing at least one pigment and having a relatively large reflectance. Furthermore, since the insulating layer 11 is often exposed to light by using a g-line ($\lambda$=435 nm) or an h-line ($\lambda$=405 μm) of a mercury lamp in the photolithography method, and a violet to blue wavelength region in the visible light region contributes to the exposure of the insulating layer 11, a deterioration in resolution due to scattering of irradiation light caused by the intra-insulating-layer crystal can be prevented by reducing the reflectance of the intra-insulating-layer crystal in the visible light region.

Second Embodiment

Figure 6:
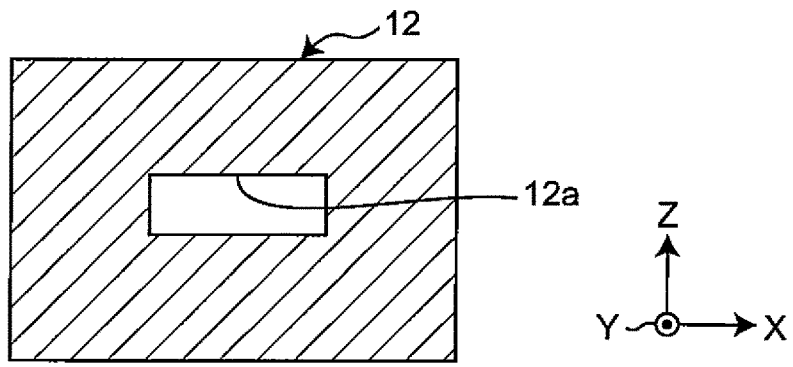
FIG. 6 is a plan view showing a form of a mark layer.
Figure 7A:
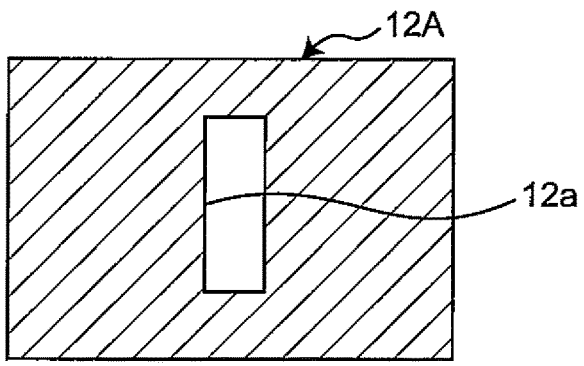
FIG. 7A is a plan view showing another form of a mark layer.
Figure 7B:
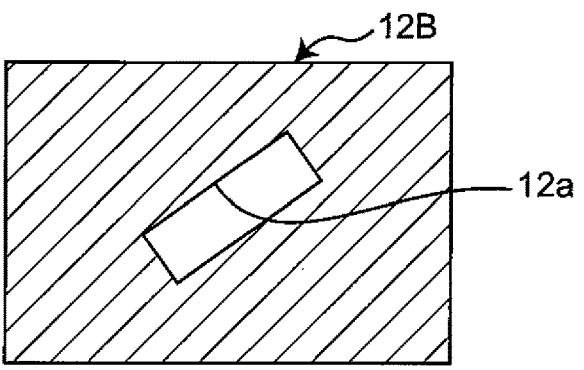
FIG. 7B is a plan view showing another form of a mark layer.
Figure 7C:
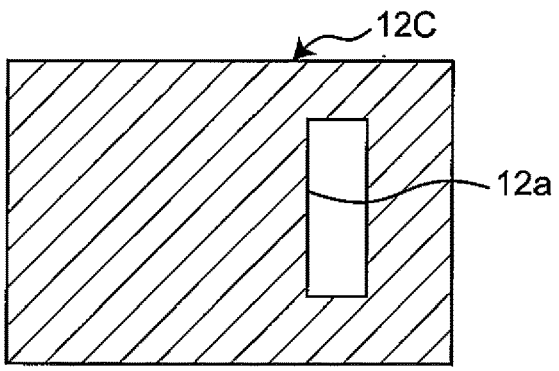
FIG. 7C is a plan view showing another form of a mark layer.
Figure 7D:
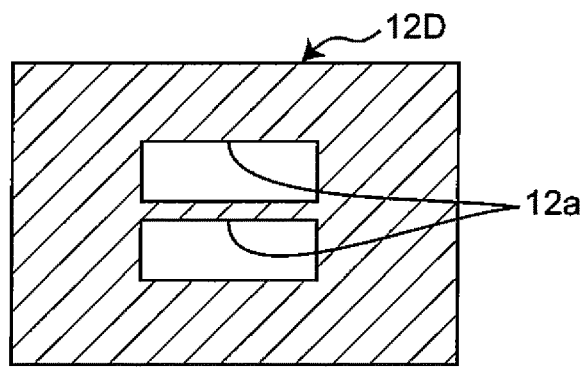
FIG. 7D is a plan view showing another form of a mark layer.
Figure 7E:
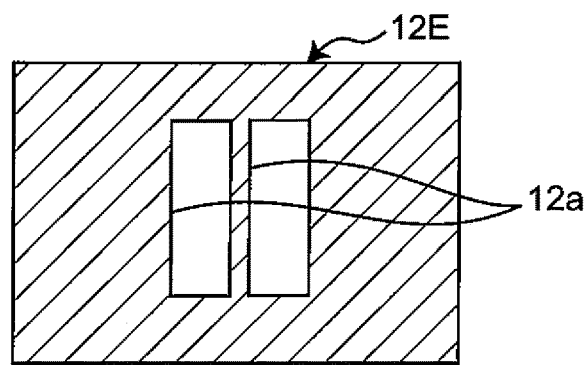
FIG. 7E is a plan view showing another form of a mark layer.
Figure 7F:
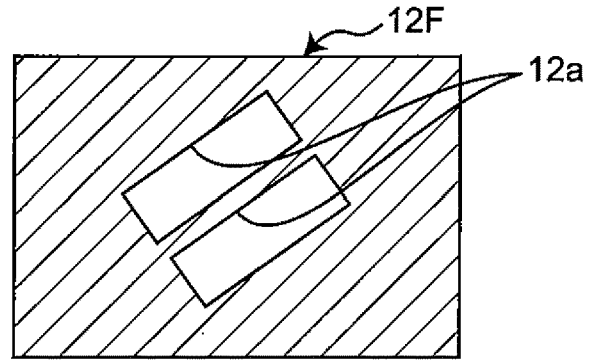
FIG. 7F is a plan view showing another form of a mark layer.
Figure 7G:
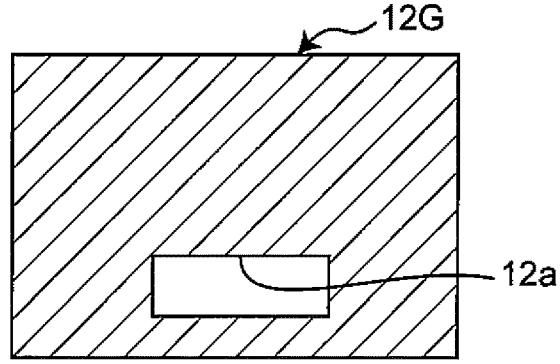
FIG. 7G is a plan view showing another form of a mark layer.
Figure 7H:
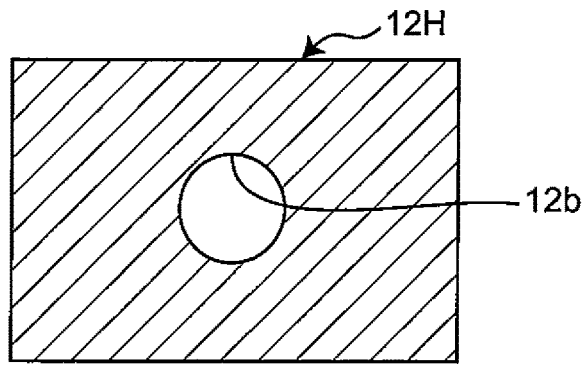
FIG. 7H is a plan view showing another form of a mark layer.
Figure 7I:
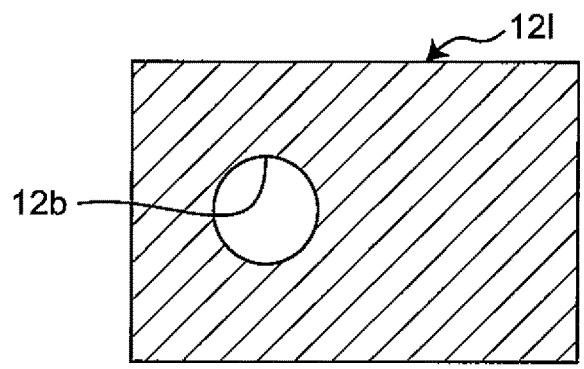
FIG. 7I is a plan view showing another form of a mark layer.
Figure 7J:
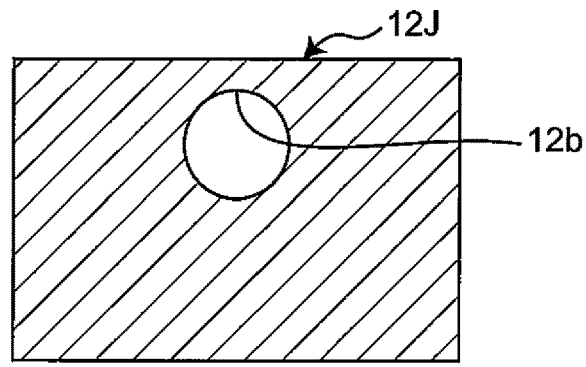
FIG. 7J is a plan view showing another form of a mark layer.
Figure 7K:
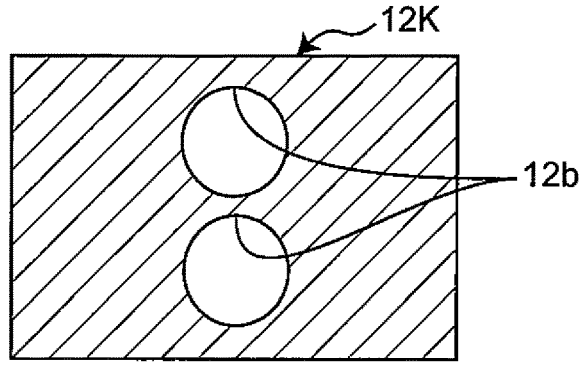
FIG. 7K is a plan view showing another form of a mark layer.
Figure 7L:
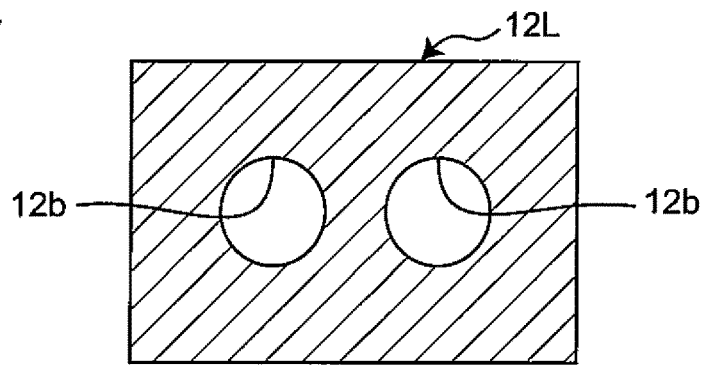
FIG. 7L is a plan view showing another form of a mark layer.
Figure 7M:
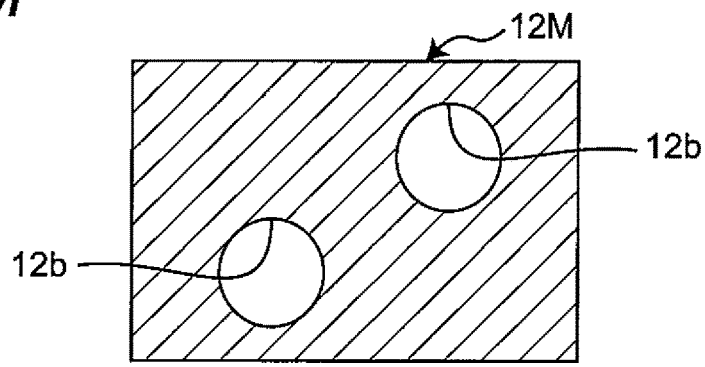
FIG. 7M is a plan view showing another form of a mark layer.
Figure 7N:
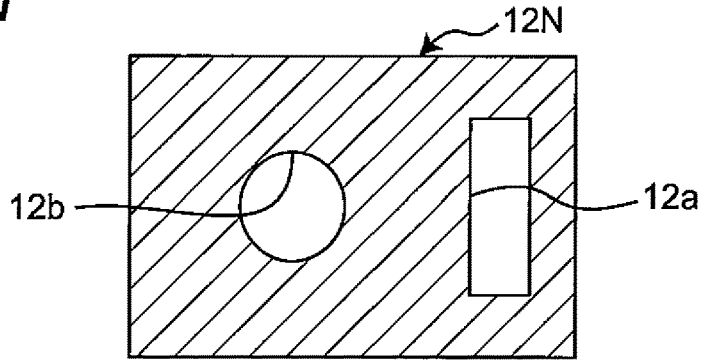
FIG. 7N is a plan view showing another form of a mark layer.
Figure 7O:
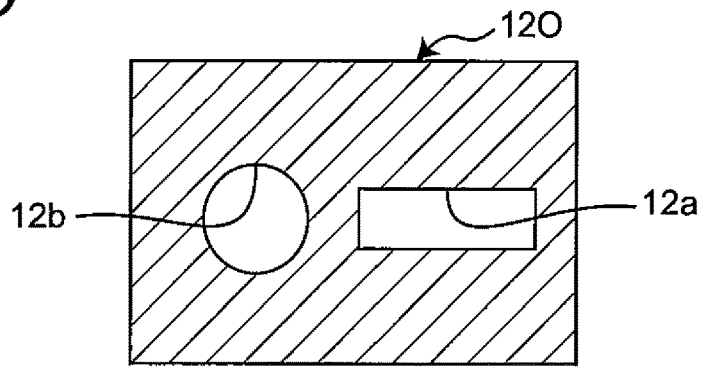
FIG. 7O is a plan view showing another form of a mark layer.

FIGS. 6 and 7A to 7O are plan views showing multiple forms of mark layers. The multiple types of mark layers are different in the shape, number, direction, and arrangement of through-holes, and the different configurations will hereinafter be described.

As shown in FIG. 6, the mark layer 12 is the mark layer 12 of the first embodiment, the through-hole 12a is rectangular, and the longitudinal direction of the through-hole 12a coincides with the horizontal direction (X direction). As shown in FIG. 7A, in a mark layer 12A, the longitudinal direction of the through-hole 12a coincides with the vertical direction (Z direction). As shown in FIG. 7B, in a mark layer 12B, the longitudinal direction of the through-hole 12a coincides with an upper right diagonal direction. As shown in FIG. 7C, in a mark layer 12C, the longitudinal direction of the through-hole 12a coincides with the vertical direction, and the through-hole 12a is located on the right side of the mark layer 12C.

As shown in FIG. 7D, in a mark layer 12D, the longitudinal direction of the through-holes 12a coincides with the horizontal direction, and the two through-holes 12a are arranged in the vertical direction. As shown in FIG. 7E, in a mark layer 12E, the longitudinal direction of the through-holes 12a coincides with the vertical direction, and the two through-holes 12a are arranged in the horizontal direction. As shown in FIG. 7F, in a mark layer 12F, the longitudinal direction of the through-holes 12a coincides with an upper right diagonal direction, and the two through-holes 12a are arranged in an upper left diagonal direction. As shown in FIG. 7G, in a mark layer 12G, the longitudinal direction of the through-hole 12a coincides with the horizontal direction, and the through-hole 12a is located on the lower side of the mark layer 12G.

As shown in FIG. 7H, in a mark layer 12H, a through-hole 12b is circular, and the through-hole 12b is located at the center of the mark layer 12H. As shown in FIG. 7I, in a mark layer 12I, the through-hole 12b is located on the left side of the mark layer 12I. As shown in FIG. 7J, in a mark layer 12J, the through-holes 12b are located on the upper side of the mark layer 12J. As shown in FIG. 7K, in a mark layer 12K, two through-holes 12b are arranged in the vertical direction.

As shown in FIG. 7L, in a mark layer 12L, the two through-holes 12b are arranged in the horizontal direction. As shown in FIG. 7M, in a mark layer 12M, the two through-holes 12b are arranged in an upper right diagonal direction. As shown in FIG. 7N, in a mark layer 12N, the longitudinal direction of the rectangular through-hole 12a coincides with the vertical direction, and the through-hole 12a is located on the right side of the mark layer 12N, while the circular through-hole 12b is located on the left side of the mark layer 12N. As shown in FIG. 7O, in a mark layer 12O, the longitudinal direction of the rectangular through-hole 12a coincides with the horizontal direction, and the through-hole 12a is located on the right side of the mark layer 12O, while the circular through-hole 12b is located on the left side of the mark layer 12O.

By varying the shape, number, direction, and arrangement of the through-holes of the mark layers as described above, the mark layers can be distinguished in more various ways. Particularly, the shape, number, direction, and arrangement of the through-holes of the mark layer described above are illustrative only, and other shapes, numbers, directions, and arrangements may be used. For example, any two or more of the through-holes 12a, 12b in the mark layers 12, 12A to 12O may be combined, or any shapes, numbers, directions, and arrangements may partially be combined. Additionally, the X, Y, and Z directions in the inductor component 1 are defined for convenience of description, and therefore, forms of the through-holes of the mark layers obtained by appropriately switching these directions may be used.

The present disclosure is not limited to the embodiments described above and may be changed in design without departing from the spirit of the present disclosure. For example, respective feature points of the first and second embodiments may variously be combined.

Although the mark layers constitute the first side surface and the second side surface of the outer surface of the element body in the embodiments, the mark layers may constitute at least one surface in the outer surface of the element body. Specifically, one of the uppermost and lowermost layers in the lamination direction (Y direction) may be the mark layer, and the opposite side may be the insulating layer.

Although the axis of the coil is arranged to coincide with the opposing direction of the first side surface and the second side surface of the element body (i.e., the coil is horizontally wound) in the embodiments, the axis of the coil may be arranged to coincide with the opposing direction of the bottom surface and the top surface of the element body (i.e., the coil is vertically wound).

Although the external electrodes are L-shaped electrodes in the embodiments, the external electrodes may be bottom electrodes or five-sided electrodes.

Example of Method of Manufacturing Inductor Component

An example of a method of manufacturing the inductor component will be described.

First, the method includes preparing a mark layer paste containing a pigment such as $CoAl_2O_2$ or $TiO_2$ and mainly composed of a borosilicate glass powder, an insulating paste containing crystals of quartz etc. as a filler and mainly composed of a borosilicate glass powder, and a conductive paste mainly composed of Ag. The mark layer paste and the insulating paste serve as the mark layers and the insulating layers, respectively, after firing described later. In this case, the insulating layers contain the intra-insulating-layer base material that is amorphous borosilicate glass and the intra-insulating-layer crystal that is a filler, and the mark layers contain the intra-mark-layer base material that is amorphous borosilicate glass and the intra-mark-layer crystal that is the pigment. The conductive paste serves as the coil wirings, the via wirings, and the first and second external electrodes depending on a position of application after firing described later. In this embodiment, since a photolithography method is used, the mark layer paste, the insulating paste, and the conductive paste have photosensitivity.

A required amount of the mark layer paste is then applied onto a carrier film by screen printing to form the lowermost layer. The lowermost layer is a portion serving as the mark layer on the lower side in the lamination direction. At this point, a through-hole may be formed as necessary in the lowermost layer by a patterning step using the photolithography method. A required amount of the insulating paste is then applied onto the lowermost layer by screen printing to form a portion serving as the insulating layer.

A required amount of the conductive paste is then applied and formed on the applied insulating paste by screen printing, and a portion serving as the coil wiring and the first and second external electrodes is formed by a patterning step using the photolithography method.

A required amount of the insulating paste is then applied by screen printing onto the insulating paste on which the conductive paste is applied and patterned. Additionally, an opening is formed in the insulating paste by a patterning step using the photolithography method.

A required amount of the conductive paste is then applied by screen printing onto the insulating paste provided with the opening. At this point, the opening is filled with the conductive paste to form a portion serving as the via wiring and the first and second external electrodes. In the same manner as described above, a portion serving as the coil wiring and the first and second external electrodes is formed by a patterning step using the photolithography method.

By repeating the steps described above, portions serving as the insulating layers, the coil wirings, the via wirings, and the first and second external electrodes are further formed.

Required amounts of the insulating paste and the mark layer paste are repeatedly applied in this order by screen printing to form the upper insulating layer and the uppermost layer. The uppermost layer is a portion serving as the mark layer located on the upper side in the lamination direction. At this point, a through-hole may be formed as necessary in the uppermost layer by a patterning step using the photolithography method.

Through the steps described above, a mother laminated body is obtained. The mother laminated body is formed such that multiple portions serving as inductor components are arranged in a matrix shape. The mother laminated body is then cut by dicing etc. into multiple unfired laminated bodies. At the cutting step of the mother laminate, portions serving as the first and second external electrodes are exposed from the laminated bodies on cut surfaces formed by cutting.

The unfired laminated bodies are fired under predetermined conditions to obtain element bodies provided with the mark layers, the insulating layers, the coil wirings, the via wirings, and the first and second external electrodes. The element bodies are further subjected to barrel finishing, and subsequently, Ni plating having a thickness of 2 μm to 10 μm and Sn plating having a thickness of 2 μm to 10 μm are formed by barrel plating on the portions where the first and second external electrodes are exposed from the element bodies. Through the steps described above, the inductor component is completed.

The formation of the mark layer paste, the insulating paste, and the conductive paste is not limited to the screen printing and the patterning using the photolithography method and may be performed by, for example, a printing lamination method in which printing by a screen plate having an opening portion and opening by a laser are repeatedly performed, or a sheet laminating method in which the printing and the opening are performed for each layer to form multiple sheets before the sheets are pressure-bonded. Alternatively, the coil wirings, the via wirings, and the first and second external electrodes may be formed without using the conductive paste by a method using etching for patterning a conductor film formed by a sputtering method, a vapor deposition method, pressure bonding of a foil, etc., or by a method including formation of a negative pattern with a resist on a seed layer of a conductor, further formation of a conductor by plating in an opening portion of the resist, and subsequent removal of unnecessary portions of the resist and the seed layer as in a semi-additive method. Furthermore, by forming a portion serving as a coil wiring as multiple stages to achieve a high aspect ratio, a loss due to resistance at high frequency can be reduced. More specifically, this may be a process of repeating formation/patterning of the conductor past with the photolithography method, may be a process of repeatedly laminating conductor films formed by a semi-additive method, or may be a process of forming a portion of lamination by plating.

The materials are not limited to those exemplified above, and known materials are usable. Particularly, a magnetic material may be used for the mark layer and the insulating layer.

The method of forming the insulating layer is not limited to the above description, and the insulating layer may be formed by spin coating of a resin material. The opening of the insulating layer may be formed by drilling.

The insulating material is not limited to glass as described above and may be a ceramic material such as ferrite, may be an organic material such as an epoxy resin, a fluororesin, and a polymer resin, or may be a composite material such as a glass epoxy resin.

The size of the inductor component is not limited to 0.4 mm×0.2 mm×0.2 mm and may be 0.6 mm×0.3 mm×0.3 mm or 0.2 mm×0.1 mm×0.1 mm, for example. The lengths in the Y direction and the Z direction may not be equal and, for example, the size may be 0.4 mm×0.2 mm×0.3 mm. The method of forming the external electrodes is not limited to the method of applying plating to the first and second external electrodes embedded in the element body and exposed by cutting and may be a method including forming external electrodes by dipping of a conductor paste, a sputtering method, etc. after cutting and then applying plating thereto without embedding the external electrodes.

What is claimed is:

1. An inductor component comprising:
an element body, the element body including a plurality of insulating layers and a mark layer constituting a portion of an outer surface of the element body, the plurality of insulating layers and the mark layer containing K, and a K abundance ratio (atom %) in the mark layer being higher than a K abundance ratio (atom %) in all of the plurality of insulating layers;
a helically wound coil disposed in the element body; and
an external electrode disposed in the element body and electrically connected to the coil,
wherein the plurality of insulating layers each contains an amorphous intra-insulating-layer base material, and
the mark layer includes an amorphous intra-mark-layer base material and an intra-mark-layer crystal containing at least one or more pigments.

2. The inductor component according to claim 1, wherein the plurality of insulating layers each further contains an intra-insulating-layer crystal,
wherein
in a reflection spectrum for light having a wavelength of from 380 nm to 780 nm, a maximum value of reflectance of the pigment of the intra-mark-layer crystal is greater than a maximum value of reflectance of the intra-insulating-layer crystal.

3. The inductor component according to claim 2, wherein in the reflection spectrum for light having a wavelength of from 380 nm to 780 nm, the reflectance of the pigment of the intra-mark-layer crystal has the maximum value at a wavelength different from a wavelength at which the reflectance of the intra-insulating-layer crystal has the maximum value.

4. The inductor component according to claim 2, wherein in the reflection spectrum for light having a wavelength of from 380 nm to 780 nm, the reflectance of the intra-insulating-layer crystal is 0.4 or less.

5. The inductor component according to claim 2, wherein the intra-insulating-layer crystal is quartz.

6. The inductor component according to claim 2, wherein the pigment is an oxide containing at least one of Ti, Co, Al, and Zr.

7. The inductor component according to claim 2, wherein the intra-mark-layer base material is an amorphous glass containing B, Si, O, and K as main components.

8. The inductor component according to claim 2, wherein the intra-insulating-layer base material is an amorphous glass containing B, Si, O, and K as main components.

9. The inductor component according to claim 1, wherein the mark layer has a through-hole constituting a distinguishing mark, and
at least one of the plurality of the insulating layers is exposed from the through-hole.

10. The inductor component according to claim 9, wherein
at least one of the plurality of the insulating layers enters the through-hole.

11. The inductor component according to claim 9, wherein
a shortest distance between an inner surface of the through-hole and the coil is 10 μm or more when viewed in a direction orthogonal to the mark layer.

12. The inductor component according to claim 3, wherein
in the reflection spectrum for light having the wavelength of from 380 nm to 780 nm, the reflectance of the intra-insulating-layer crystal is 0.4 or less.

13. The inductor component according to claim 3, wherein
the intra-mark-layer base material is an amorphous glass containing B, Si, O, and K as main components.

14. The inductor component according to claim 4, wherein
the intra-mark-layer base material is an amorphous glass containing B, Si, O, and K as main components.

15. The inductor component according to claim 5, wherein
the intra-mark-layer base material is an amorphous glass containing B, Si, O, and K as main components.

16. The inductor component according to claim 3, wherein
the intra-insulating-layer base material is an amorphous glass containing B, Si, O, and K as main components.

17. The inductor component according to claim 4, wherein
the intra-insulating-layer base material is an amorphous glass containing B, Si, O, and K as main components.

18. The inductor component according to claim 2, wherein
the mark layer has a through-hole constituting a distinguishing mark, and
at least one of the plurality of the insulating layers is exposed from the through-hole.

19. The inductor component according to claim 3, wherein
the mark layer has a through-hole constituting a distinguishing mark, and
at least one of the plurality of the insulating layers is exposed from the through-hole.

20. The inductor component according to claim 10, wherein
a shortest distance between an inner surface of the through-hole and the coil is 10 μm or more when viewed in a direction orthogonal to the mark layer.

* * * * *